(12) United States Patent (10) Patent No.: US 8,314,467 B1
Hammond et al. (45) Date of Patent: Nov. 20, 2012

(54) THERMALLY TOLERANT ELECTROMECHANICAL ACTUATORS

(75) Inventors: Jonathan Hale Hammond, Oak Ridge, NC (US); Jan Vandemeer, Mesa, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 76 days.

(21) Appl. No.: 12/710,108

(22) Filed: Feb. 22, 2010

Related U.S. Application Data

(60) Provisional application No. 61/156,965, filed on Mar. 3, 2009, provisional application No. 61/154,238, filed on Feb. 20, 2009.

(51) Int. Cl.
*H01L 29/84* (2006.01)

(52) U.S. Cl. ............... 257/415; 257/414; 257/E21.481; 257/E21.002; 257/678

(58) Field of Classification Search .................. 257/415, 257/414, E21.481, E21.002, 678, 684
See application file for complete search history.

(56) References Cited

U.S. PATENT DOCUMENTS

| | | | |
|---|---|---|---|
| 6,625,004 B1 | 9/2003 | Musolf et al. | |
| 6,639,494 B1 | 10/2003 | Bluzer | |
| 6,777,765 B2 | 8/2004 | Chen et al. | |
| 7,135,766 B1 | 11/2006 | Costa et al. | |
| 7,956,709 B2 | 6/2011 | Watanabe et al. | |
| 7,999,643 B1 | 8/2011 | Dening et al. | |
| 8,018,308 B2 | 9/2011 | Kwon et al. | |
| 2006/0012014 A1 | 1/2006 | Chen et al. | |
| 2006/0108675 A1 | 5/2006 | Colgan et al. | |
| 2006/0181379 A1 | 8/2006 | Schwartz et al. | |
| 2006/0254345 A1* | 11/2006 | King et al. ..................... 73/105 |
| 2007/0103028 A1 | 5/2007 | Lewis et al. | |
| 2007/0172975 A1 | 7/2007 | Tomomatsu et al. | |
| 2007/0202626 A1* | 8/2007 | Liu ................................ 438/48 |
| 2007/0281381 A1 | 12/2007 | Ayazi | |
| 2008/0164542 A1 | 7/2008 | Yang et al. | |

OTHER PUBLICATIONS

Costa, J. et al., "Integrated MEMS Switch Technology on SOI-CMOS," Proceedings of Hilton Head Workshop 2008: A Solid-State Sensors, Actuators and Microsystems Workshop, Jun. 2008, 4 pages.
Costa, J. et al., "A Silicon RFCMOS SOI Technology for Integrated Cellular/WLAN RF TX Modules," Proceedings of the IEEE MTS Microwave Symposium, Jun. 2007, pp. 445-448, IEEE.
Guan, Lingpeng et al, "A Fully Integrated SOI RF MEMS Technology for System-on-a-Chip Applications," IEEE Transactions on Electron Devices, Jan. 2006, pp. 167-172, vol. 53, No. 1, IEEE.
Joseph, Alvin et al., "A 0.35 um SiGe BiCMOS Technology for Power Amplifier Applications," IEEE BCTM Conference Proceedings, Sep. 30-Oct. 2, 2007, pp. 198-201, IEEE.

(Continued)

*Primary Examiner* — Mamadou Diallo
(74) *Attorney, Agent, or Firm* — Winthrow & Terranova, P.L.L.C.

(57) ABSTRACT

A micro-electromechanical systems (MEMS) switch having a thermally tolerant anchor configuration is provided. The MEMS switch includes a substrate onto which first and second conductive pads are formed. A conductive cantilever beam having a first end portion, a middle portion, a second end portion, a top surface, and a bottom surface includes an internal surface that defines an open space through the first end portion. A conductive anchor coupled to the internal surface of the first end portion extends through the open space and is coupled to the first conductive pad such that the bottom surface of the second end portion of the conductive cantilever beam is suspended above the second conductive pad by a predetermined distance. The MEMS switch also includes a conductive actuator plate formed on the substrate at a location beneath the middle portion of the conductive cantilever beam and between the first and second conductive pads.

18 Claims, 15 Drawing Sheets

OTHER PUBLICATIONS

Kelly, Dylan et al., "The State-of-the-Art of Silicon-on-Sapphire CMOS RF Switches," Proceedings of the IEEE Compound Semiconductor Symposium, Oct. 30-Nov. 2, 2005, pp. 200-205.

Mazure, Carlos et al., "Engineering Wafers for the Nanotechnology Era," Proceedings of ESSCIRC, Sep. 2005, pp. 29-38, IEEE.

Shokrani, Mohsen et al., "InGap-Plus(TM): A Low Cost Manufacturable GaAs BiFET Process Technology," Proceedings of the GaAs Mantech Conference, Nov. 2006, pp. 153-156.

Tinella, C. et al., "0.13um CMOS SOI SP6T Antenna Switch for Multi-Standard Handsets," Topic Meeting on Silicon Monolithic Circuits in RF Systems, Jan. 2006, pp. 58-61, IEEE.

Tombak, Ali et al., "A Flip-Chip Silicon IPMOS Power Amplifier and a DC/DC Converter for GSM 850/900/1800/1900 MHz Systems," Proceedings of the IEEE Radio Frequency Integrated Circuits Symposium, Jun. 2007, pp. 79-82, IEEE.

Wohlmuth, Walter A. et al., "E-/D-pHEMT Technology for Wireless Components," Proceedings of the Compound Semiconductor Circuit Symposium, Oct. 2004, pp. 115-118, IEEE.

De Silva, A.P. et al., "Motorola MEMS switch technology for high frequency applications," 2001 Microelectromechanical Systems Conference, Aug. 2001, pp. 22-24, IEEE.

Reines, I. et al., "Performance of Temperature-Stable RF MEMS Switched Capacitors under High RF Power Conditions," 2010 IEEE MTT-S International Microwave Symposium Digest (MTT), May 23-28, 2010, pp. 292-295, IEEE.

Notice of Allowance for U.S. Appl. No. 11/955,918 mailed Apr. 2, 2010, 9 pages.

Final Office Action for U.S. Appl. No. 11/955,918 mailed Jan. 8, 2010, 11 pages.

Non-final Office Action for U.S. Appl. No. 11/955,918 mailed Jun. 25, 2009, 14 pages.

Non-final Office Action for U.S. Appl. No. 12/709,979 mailed Feb. 17, 2012, 12 pages.

Notice of Allowance for U.S. Appl. No. 12/709,979 mailed Sep. 10, 2012, 9 pages.

* cited by examiner

US 8,314,467 B1

THERMALLY TOLERANT ELECTROMECHANICAL ACTUATORS

RELATED APPLICATIONS

This application claims the benefit of provisional patent application Ser. No. 61/154,238, filed Feb. 20, 2009, and provisional patent application Ser. No. 61/156,965, filed Mar. 3, 2009, the disclosures of which are hereby incorporated herein by reference in their entireties. This application also relates to U.S. patent application Ser. No. 12/710,195 entitled "Thermally Neutral Anchor Configuration for an Electromechanical Actuator" and also to U.S. patent application Ser. No. 12/709,979 entitled "Thermally Tolerant Anchor Configuration for a Circular Cantilever," both of which were concurrently filed on Feb. 22, 2010, the disclosures of which are hereby incorporated herein by reference in their entireties. This application further relates to U.S. patent application Ser. No. 11/955,918 entitled "Integrated MEMS Switch," filed on Dec. 13, 2007, now U.S. Pat. No. 7,745,892, the disclosure of which is hereby incorporated by reference in its entirety.

FIELD OF THE DISCLOSURE

The present disclosure relates to RF MEMS switches, and in particular the stable volume manufacture of RF MEMS switches.

BACKGROUND

As electronics evolve, there is an increased need for miniature switches that are provided on semiconductor substrates along with other semiconductor components to form various types of circuits. These miniature switches often act as relays, and are generally referred to as micro-electro-mechanical system (MEMS) switches. MEMS switches generally include a moveable portion such as a cantilever, which has a first end anchored to the semiconductor substrate, and a second free end having a cantilever contact. When the MEMS switch is activated, the cantilever moves the cantilever contact against a substrate contact on the semiconductor substrate and under the cantilever contact.

Turning to FIGS. 1A and 1B, a semiconductor device 10 having a MEMS switch 12 is illustrated. The MEMS switch 12 is effectively formed on a semiconductor substrate 14. The MEMS switch 12 includes a cantilever 16, which is formed from a conductive material, such as gold. The cantilever 16 has a first end and a second end. The first end is coupled to the semiconductor substrate 14 by an anchor 18. The first end of the cantilever 16 is also electrically coupled to a first conductive pad 20 at or near the point where the cantilever 16 is anchored to the semiconductor substrate 14. Notably, the first conductive pad 20 may play a role in anchoring the first end of the cantilever 16 to the semiconductor substrate 14 as depicted.

The second end of the cantilever 16 forms or is provided with a cantilever contact 22, which is suspended over a contact portion 24 of a second conductive pad 26. Thus, when the MEMS switch 12 is actuated, the cantilever 16 moves the cantilever contact 22 into electrical contact with the contact portion 24 of the second conductive pad 26 to electrically connect the first conductive pad 20 to the second conductive pad 26.

To actuate the MEMS switch 12, and in particular to cause the second end of the cantilever 16 to move the cantilever contact 22 into contact with the contact portion 24 of the second conductive pad 26, an actuator plate 28 is disposed over a portion of the semiconductor substrate 14 and under the middle portion of the cantilever 16. To actuate the MEMS switch 12, a potential difference is applied between the cantilever 16 and the actuator plate 28. The presence of this potential difference creates an electrostatic field that effectively moves the second end of the cantilever 16 toward the actuator plate 28, thus changing the position of the cantilever 16 from the position illustrated in FIG. 1A to the position illustrated in FIG. 1B.

Typically, the first conductive pad 20, the second conductive pad 26, and the actuator plate 28 are formed from a single metallic or conductive layer, such as gold, copper, platinum, or the like. The particular form factor for the first conductive pad 20, second conductive pad 26, and actuator plate 28 is provided through an etching or other patterning technique. With continued reference to FIGS. 1A and 1B, the MEMS switch 12 may be encapsulated by one or more encapsulating layers 30 and 32, which make up a wafer level package (WLP) around the MEMS switch 12. Moreover, the encapsulating layers 30 and 32 form a substantially hermetically sealed cavity about the cantilever 16. The cavity is generally filled with an inert gas. Once the encapsulation layers 30 and 32 are in place and any other semiconductor components are formed on the semiconductor substrate 14, a plastic overmold 34 may be provided over the encapsulation layers 30 and 32 and any other semiconductor components.

With continued reference to FIGS. 1A and 1B, the substrate 14 is preferably formed using a semiconductor-on-insulator process, such as a silicon- or sapphire-on-insulator process. In particular, the substrate 14 includes a handle wafer 36 that is formed from silicon, sapphire, glass, or like material to form a foundation layer for the semiconductor device 10. The handle wafer 36 is typically a few hundred microns thick. An insulator layer 38 is formed over the handle wafer 36. The insulator layer 38 is generally formed from an oxide, such as Silicon Dioxide ($SiO_2$), which may range in thickness from 0.1 to 2 microns in the preferred embodiment. A device layer 40, which may include one or more layers, is formed using an appropriate semiconductor material.

The device layer 40 is the layer or layers in which active semiconductor devices, such as transistors and diodes that employ PN junctions, are formed. The device layer 40 is initially formed as a base semiconductor layer that is subsequently doped with N-type and P-type materials to form the active semiconductor devices. Thus, the active semiconductor devices, except for any necessary contacts or connections traces, are generally contained within the device layer 40. Those skilled in the art will recognize various techniques for forming active semiconductor devices in the device layer 40. A metal-dielectric stack 42 is formed over the device layer 40, wherein a plurality of metal and dielectric layers are alternated to facilitate connection with and between the active devices formed in the device layer 40. Further, in the preferred embodiment the handle wafer 36 is made of a high-resistivity semiconductor material where resistance is greater than 50 ohm-cm.

With the present disclosure, active semiconductor devices may be formed in the device layer 40 and connected to one another via the metal-dielectric stack 42 directly underneath the MEMS switch 12. Since the device layer 40 resides over the insulator layer 38, high voltage devices, which may exceed ten (10) volts in operation, may be formed directly under the MEMS switch 12 and connected in a way to control operation of the MEMS switch 12 or associated circuitry. Although silicon is described in an exemplary embodiment, the semiconductor material for the device layer 40 may include gallium arsenide (GaAs), gallium nitride (GaN), indium phosphide (InP), silicon germanium (SiGe), sapphire, and like semiconductor materials. The device layer 40 typically ranges in thickness from 0.1 microns to 20 or more microns.

As illustrated in FIGS. 1A and 1B, a passivation layer 44 may be provided over the metal-dielectric stack 42. As may be best seen from the perspective view of FIG. 2, a metal layer used to form the first conductive pad 20, the second conductive pad 26, and the actuator plate 28 may be formed over the passivation layer 44 and etched to form the respective ones of the first conductive pad 20, the second conductive pad 26, and the actuator plate 28. Prior to packaging, the cantilever 16 is 'released' and is free to actuate or deform.

In particular, the cantilever 16 may be released following formation of a small micro-cavity surrounding the MEMS switch 12. A sacrificial material such as polymethylglutarimide (PMGI) is etched away using wet etches. Following drying and cleaning of the MEMS switch 12, a dielectric is used to hermetically seal the micro-cavity. The deposition temperature for the dielectric is typically 250° C.

Later in the manufacturing process, the device can experience multiple exposures to 260° C. solder reflow during attachment of a module incorporating the MEMS switch 12 to an end-user laminate.

A problem of undesirable deformation of the MEMS switch 12 often occurs due to a significant difference in the coefficient of thermal expansion (CTE) between the metal comprising MEMS switch 12 and the semiconductor or insulator comprising passivation layer 44. The CTE of the metal making up the MEMS switch 12 often ranges from two to seven times larger than the CTE of the semiconductor or insulator making up the passivation layer 44. At room temperature (i.e., 25° C.), the difference in the CTE does not present a problem. However, during manufacture, assembly, or operation of the MEMS switch 12, the temperature of the MEMS switch 12 and the substrate 14 (FIGS. 1A and 1B) including the passivation layer 44 can range from 85° C. to 400° C. In such circumstances, particularly in the case of an ohmic contact switch function for MEMS switch 12, it is desirable to ensure that the cantilever contact 22 and second conductive pad 26 or passivation layer 44 do not make contact.

FIG. 3 illustrates how differences in CTE may lead to a thermally induced deformation of the cantilever 16. A plurality of dots shown in a side cross-section of the cantilever 16 and the anchor 18 represent individual metal domains making up the cantilever 16 and the anchor 18. As the MEMS switch 12 is heated during manufacturing and/or assembly, the metal domains migrate away from each other and thereby producing a deflection force on the cantilever 16. The deflection force is represented by an arrow at the free end of the cantilever 16. In this case, the deflection force urges the cantilever towards the passivation layer 44.

FIG. 4 depicts the results of a finite element simulation of the mechanical effects experienced by the MEMS switch 12 when the MEMS switch 12 is heated to a steady state temperature of 300° C. The finite element simulation shows when the MEMS switch 12 reaches a temperature of 300° C., the cantilever 16 will have rotated enough that the cantilever contact 22 will be in contact with the second conductive pad 26. MEMS switch 12 has a switch open state that typically maintains a one-half micrometer gap between the cantilever contact 22 and the second conductive pad 26. Further finite element simulations show that the deflection of the cantilever 16 may allow the cantilever contact 22 to traverse gap distances that exceed one-half micrometer.

Notice that a rotational axis 46 of the cantilever 16 is perpendicular to a longitudinal axis 48 of the cantilever 16. As suggested by the finite element simulations, the elevated temperatures experienced by the MEMS switch 12 during manufacturing, assembly, or operation, the cantilever 16 may be thermally deflected to rotate about the rotational axis 46. As the temperature of the MEMS switch 12 increases, the rotation of cantilever 16 may become so pronounced that the cantilever contact 22 will contact the second conductive pad 26. An adhesion between the cantilever contact 22 and the second conductive pad 26 may prevent the cantilever contact 22 and the second conductive pad 26 from breaking contact as the temperature of the MEMS switch 12 decreases. A failure to break contact between the cantilever contact 22 and the second conductive pad 26 will result in a failed MEMS switch along with a failed product incorporating the MEMS switch 12.

Significant yield loss, which may approach 80%, may be attributed to this thermally induced actuation during manufacture of devices with this kind of standard attachment configuration. Thus, the need for a structure which can prevent this kind of thermal actuation is apparent.

SUMMARY OF THE DISCLOSURE

Embodiments of the present disclosure relate to the physical and geometric configuration of an anchor attachment between a movable part of an electromechanical actuator and its underlying substrate. In particular, a first embodiment of the present disclosure is a micro-mechanical systems (MEMS) switch having a thermally tolerant anchor configuration. The disclosed MEMS switch includes a substrate onto which a first conductive pad and a second conductive pad are formed. A conductive cantilever beam having a first end portion, a second end portion, a top surface and a bottom surface includes an internal surface that defines an open space through the first end portion. The open space extends through the top surface and through the bottom surface. A conductive anchor coupled to the internal surface of the first end portion of the conductive cantilever beam extends through the open space and is coupled to the first conductive pad such that the bottom surface of the second end portion of the conductive cantilever beam is suspended above the second conductive pad by a predetermined distance. A conductive actuator plate is formed on the substrate at a location beneath the middle portion of the conductive cantilever beam and between the first and second conductive pads. In a second embodiment, a MEMS switch that includes the above disclosed features further includes a second conductive anchor attached to an external wall of a first end portion of a conductive cantilever beam comprising the second embodiment of the MEMS switch.

In operation, a potential difference applied between the conductive cantilever beam and the actuator plate urges the conductive cantilever beam to deflect towards the substrate such that electrical contacts located on the second end portion of the cantilever beam come into contact with the second conductive pad. When the potential difference applied between the conductive cantilever beam and the actuator is eliminated, the conductive cantilever beam deflects away from the substrate such that the electrical contacts break contact with the second conductive pad.

Those skilled in the art will appreciate the scope of the present disclosure and realize additional aspects thereof after reading the following detailed description in association with the accompanying drawings.

BRIEF DESCRIPTION OF THE DRAWING FIGURES

The accompanying drawing figures incorporated in and forming a part of this specification illustrates several aspects of the invention and together with the description serve to explain the principles of the invention.

Figure 8A:
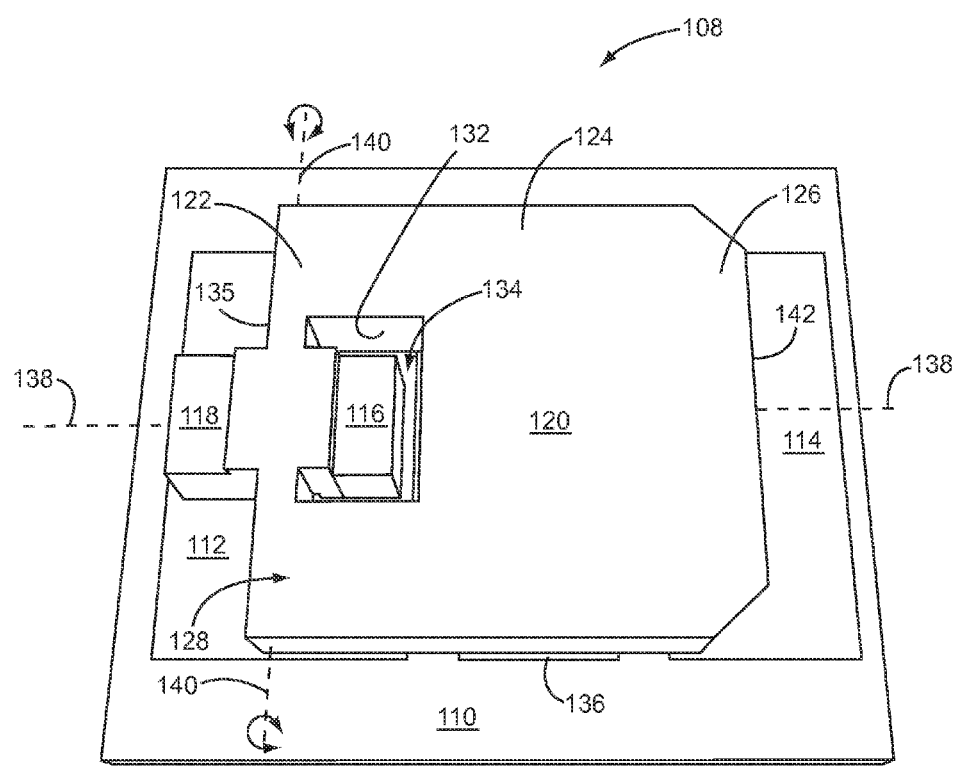
FIGS. 8A, 8B, 8C and 8D depict another embodiment of a MEMS switch according to the present disclosure.
Figure 8B:
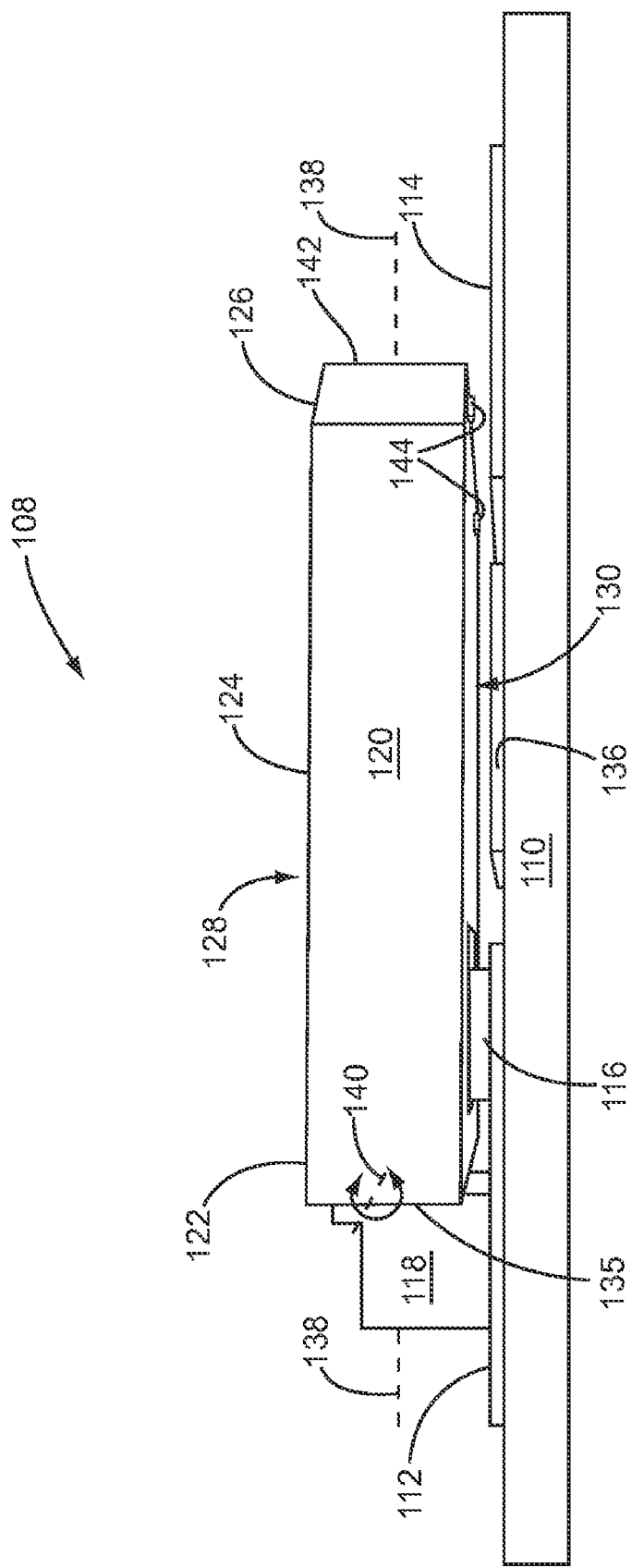
Figure 8C:
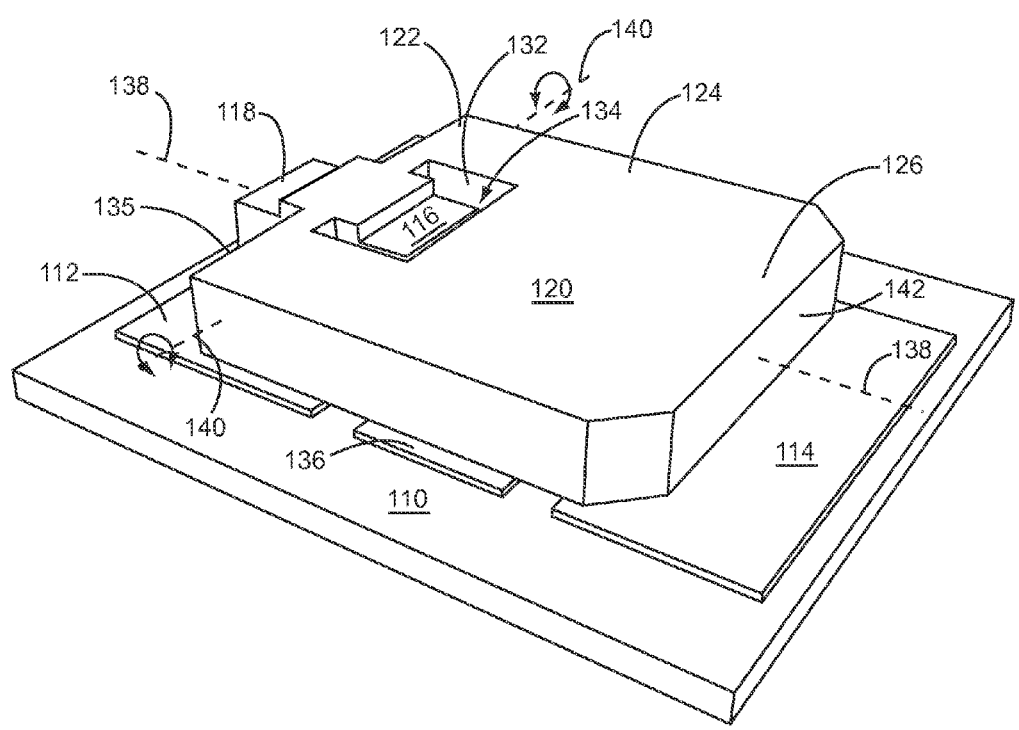
Figure 8D:
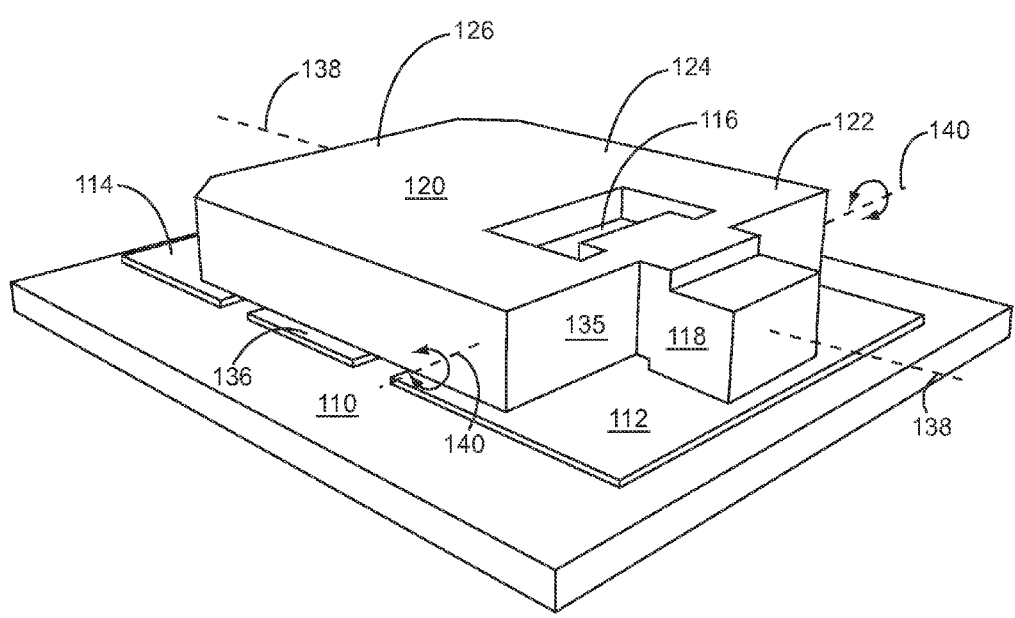
Figure 9:
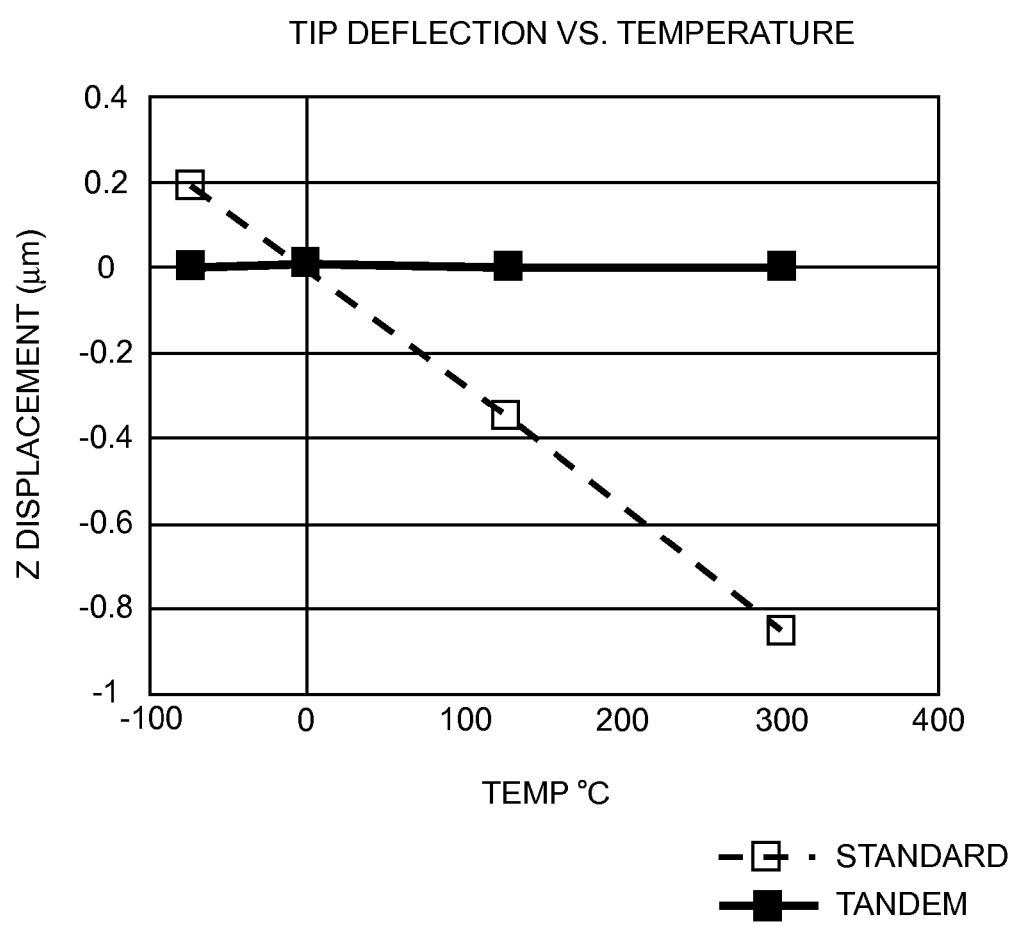

FIG. 9 compares the tip deflection of the MEMS switch of FIGS. 8A, 8B, 8C and 8D with a tip deflection of a standard MEMS switch.

DETAILED DESCRIPTION

In a typical attachment configuration for an anchor and a cantilever beam, the axis of the attachment of the cantilever beam to the anchor is at one end of the cantilever beam. In an embodiment of the present disclosure, the attachment axis is forward of an end portion of the cantilever beam. As a result, thermally induced deflections of the cantilever beam are neutralized or made positive such that a tip of the cantilever beam deflects away from a substrate over which the cantilever beam is suspended.

Figure 1A:
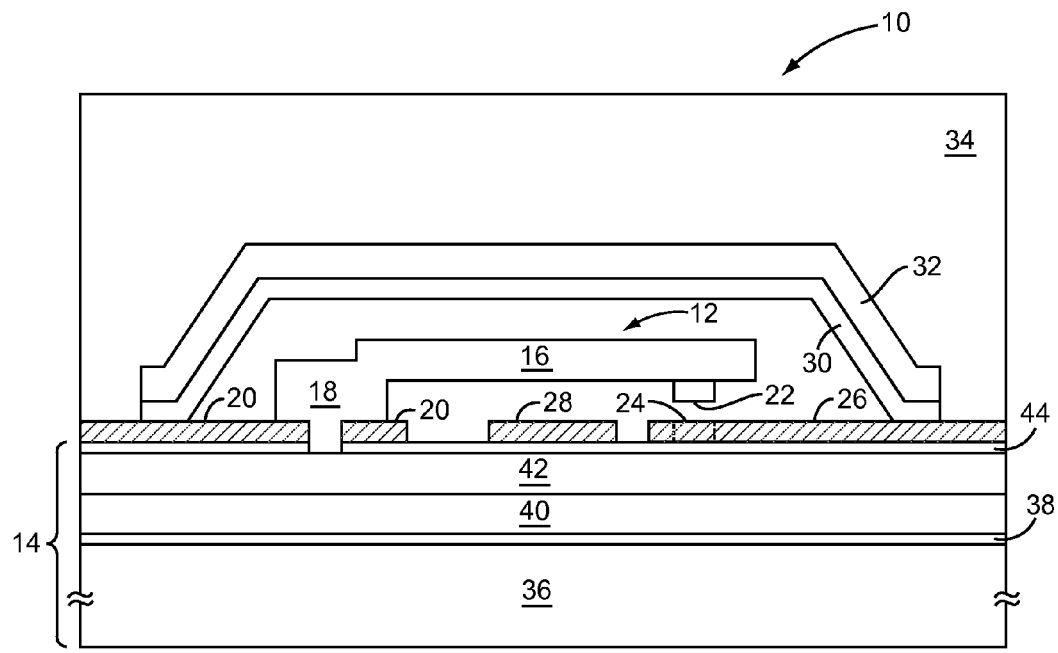
FIGS. 1A and 1B illustrate an exemplary micro-electromechanical systems (MEMS) switch in an open and closed position respectively.
Figure 1B:
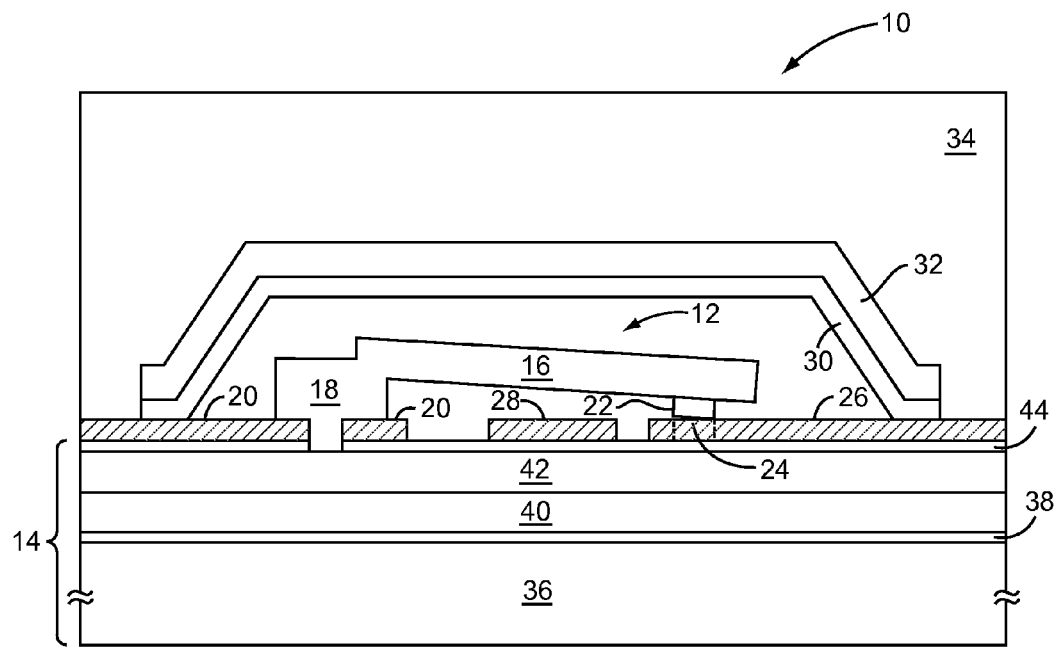
Figure 2:
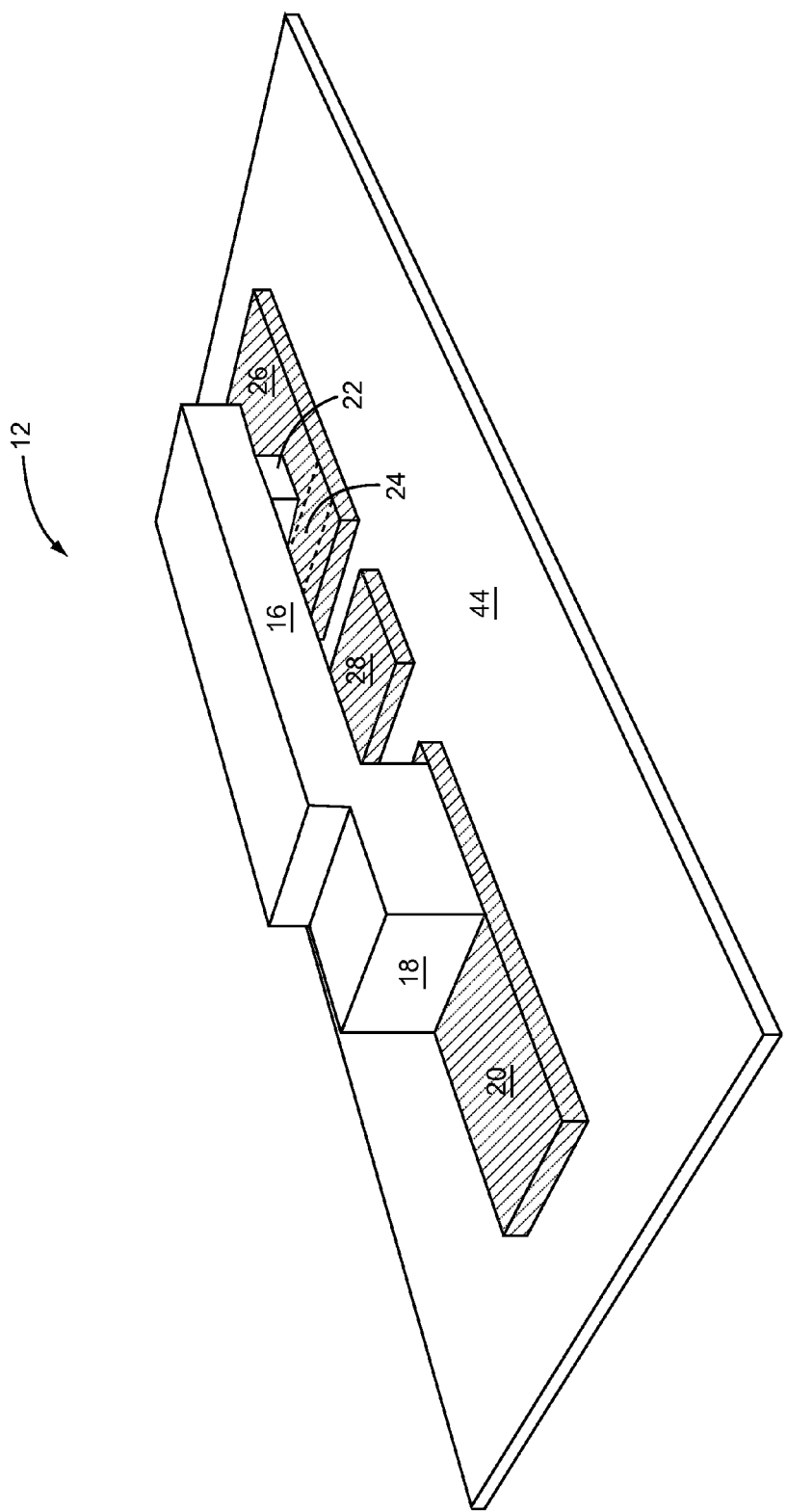
FIG. 2 is a perspective view of a portion of the MEMS switch of FIGS. 1A and 1B.
Figure 3:
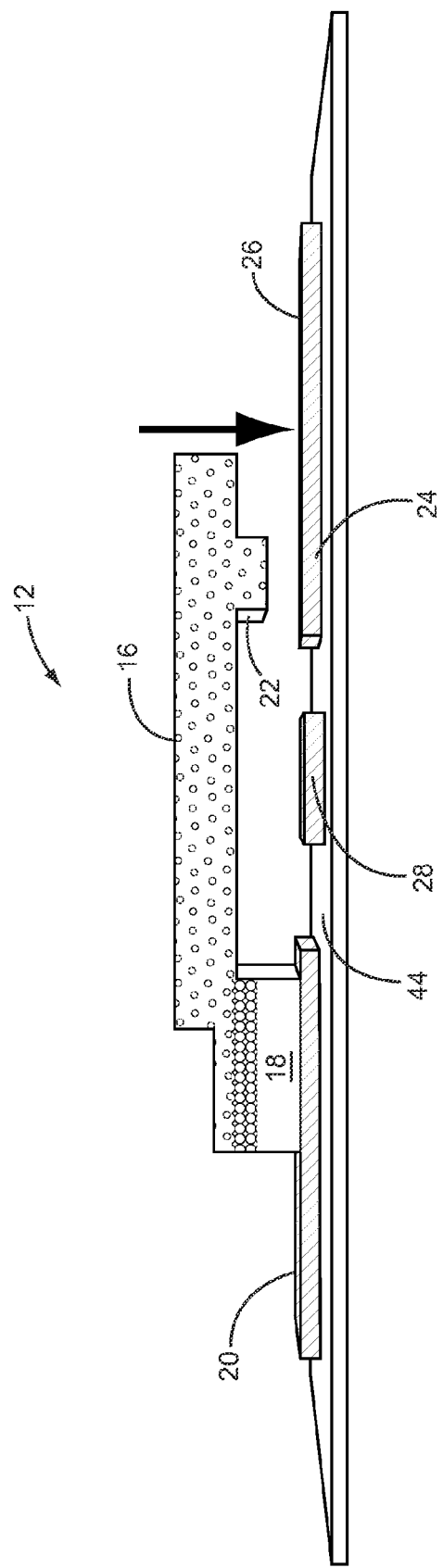
FIG. 3 illustrates the thermally induced mechanical stress in the MEMS switch during manufacturing.
Figure 4:
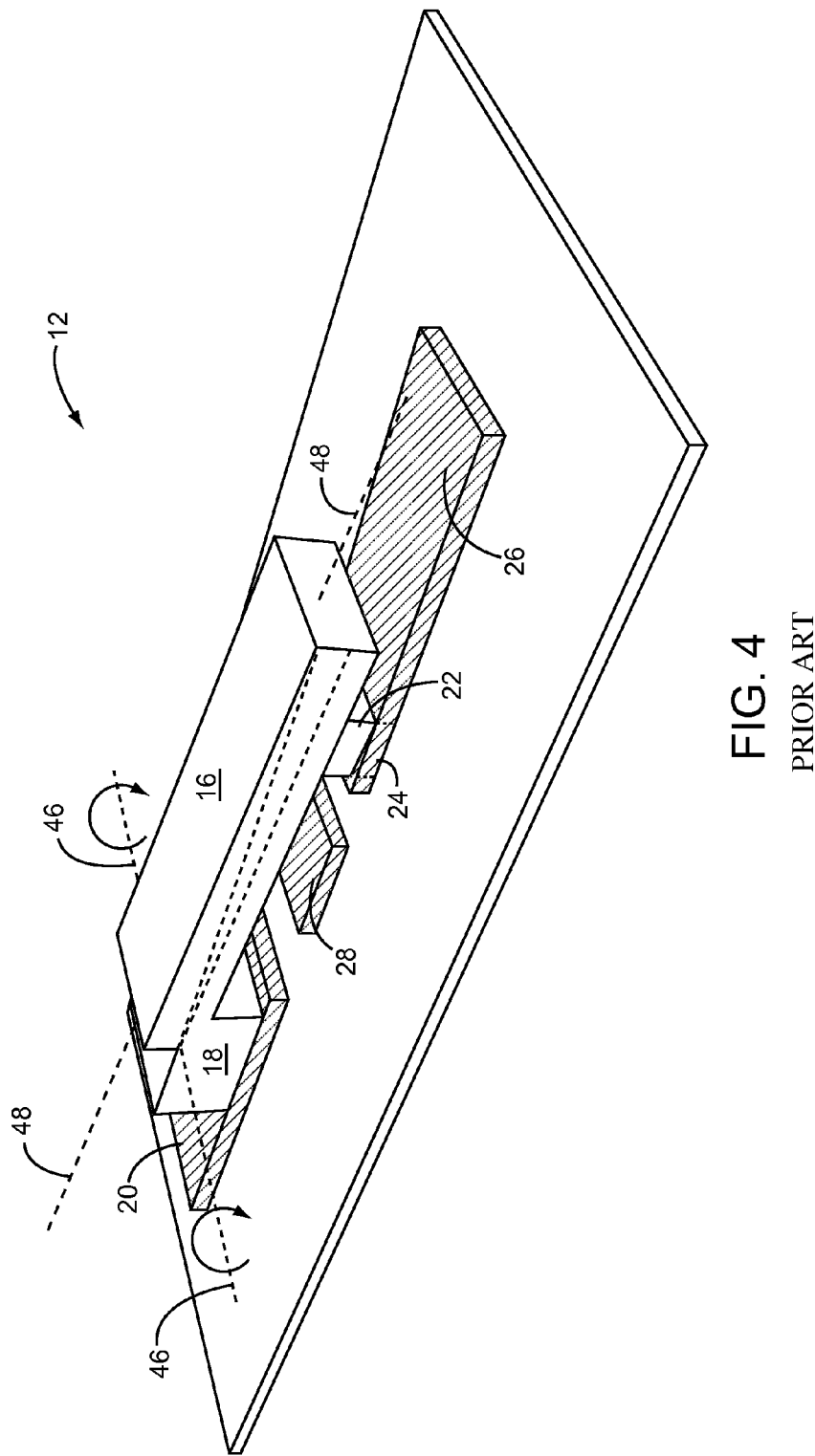
FIG. 4 depicts the failure of the MEMS switch as a result of the thermally induced mechanical stress illustrated in FIG. 3.
Figure 5A:
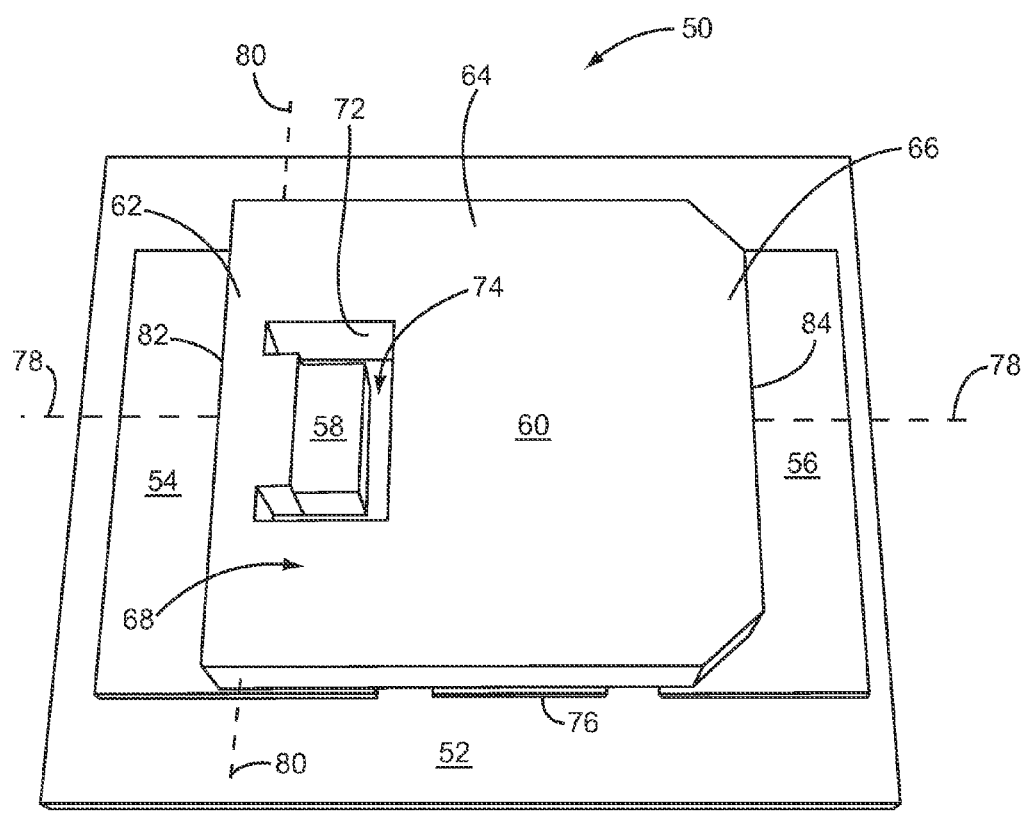
FIGS. 5A, 5B, 5C and 5D depict an embodiment of a MEMS switch according to the present disclosure.
Figure 5B:
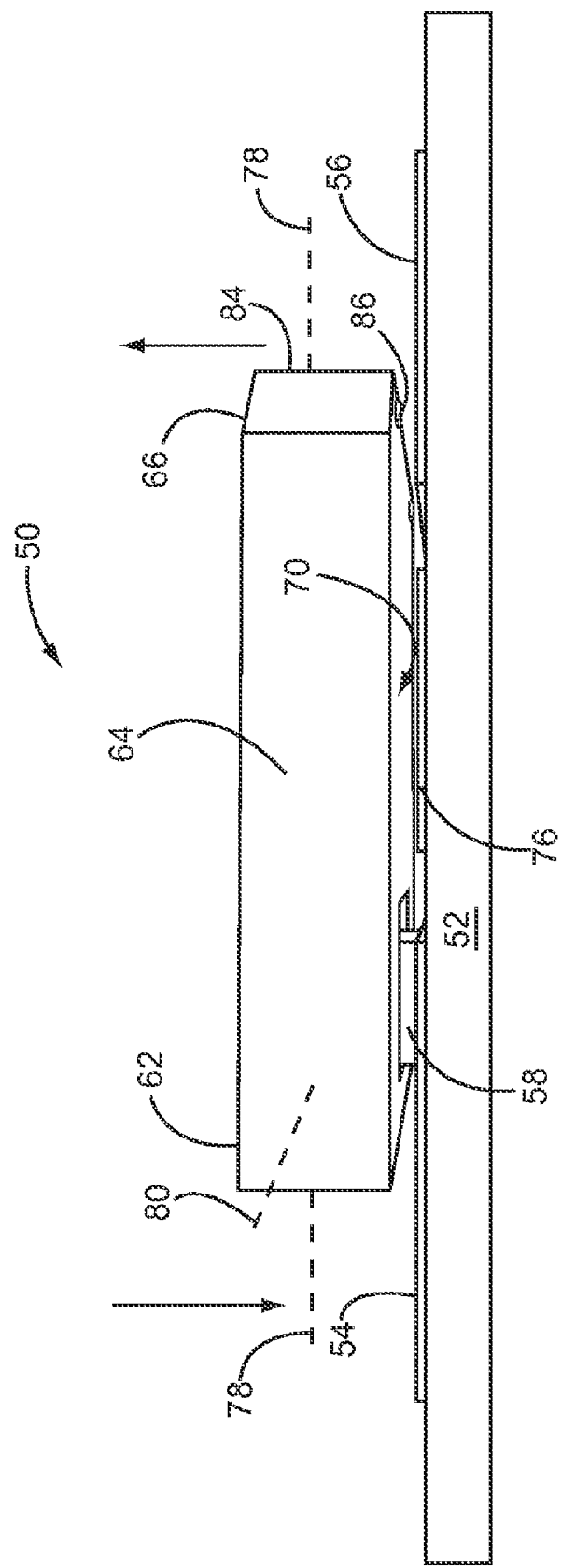
Figure 5C:
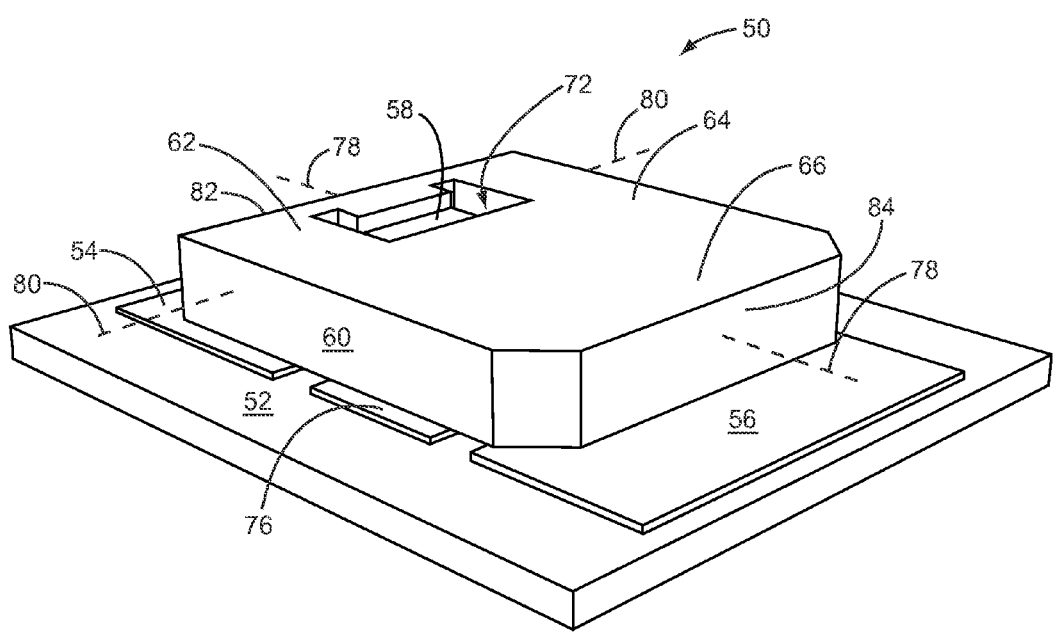
Figure 5D:
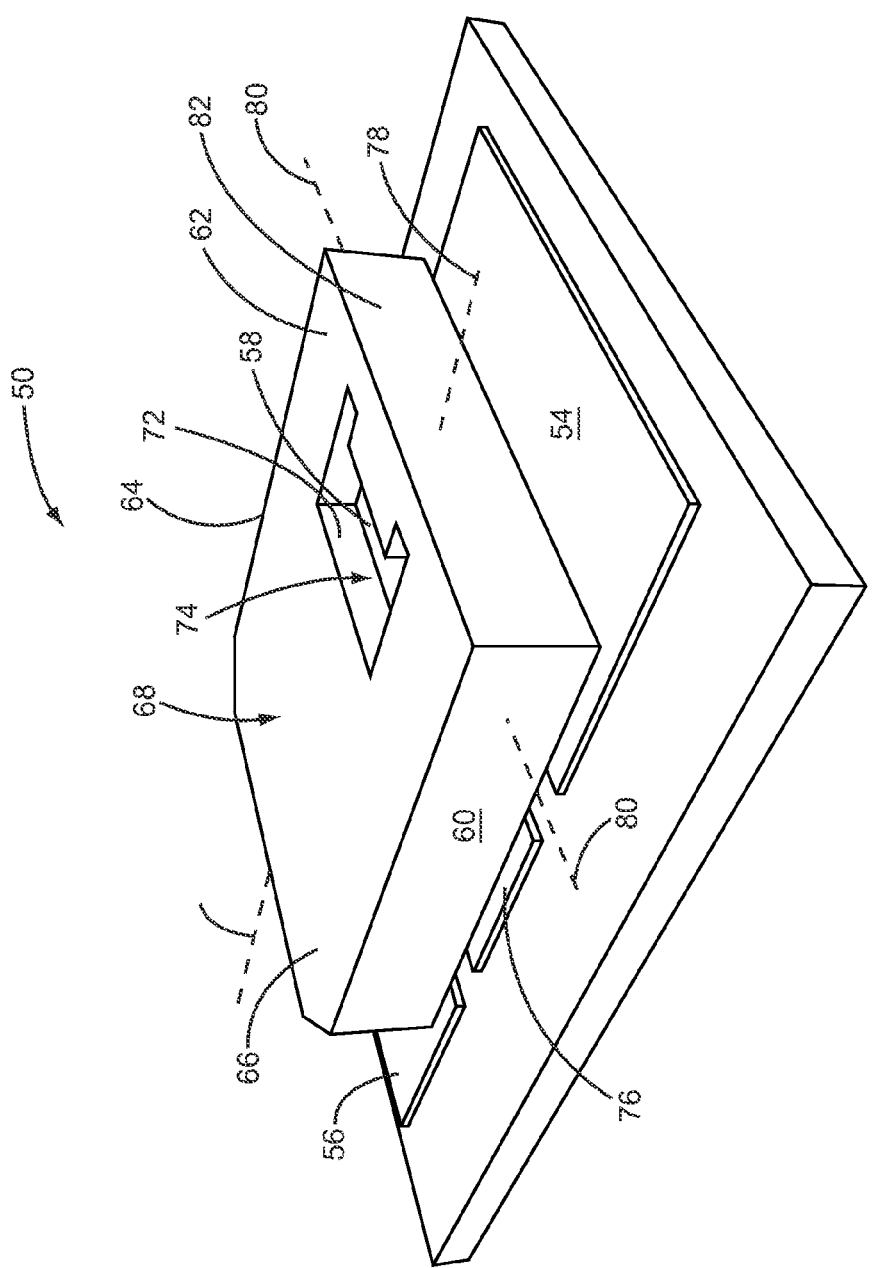

FIGS. 5A, 5B, 5C and 5D depict a micro-electromechanical systems (MEMS) switch 50 that is structured according the present disclosure. The MEMS switch 50 includes a substrate 52 onto which a first conductive pad 54 and a second conductive pad 56 are formed. A conductive anchor 58 is coupled to the first conductive pad 54. A conductive cantilever beam 60 has a first end portion 62, a middle portion 64, a second end portion 66, a top surface 68, and a bottom surface 70 (FIG. 5B). An internal surface 72 extending through the first end portion 62 of the conductive cantilever beam 60 from the top surface 68 through the bottom surface 70 defines an open space 74. The conductive anchor 58 is attached to the first end portion 62 and extends into the open space 74 towards the middle portion 64 such that the bottom surface 70 of the second end portion 66 of the conductive cantilever beam 60 is suspended and spaced above the second conductive pad 56 by a predetermined distance such as 0.5 micrometers (μm). This particular configuration of the conductive anchor 58 is referred to in this disclosure as an inset anchor configuration. The second end portion 66 of the conductive cantilever beam 60 is suspended over the second conductive pad 56 with the middle portion 64 being between the first end portion 62 and the second end portion 66. A conductive actuator plate 76 is formed onto the substrate 52 at a location beneath the middle portion 64 of the conductive cantilever beam 60 and between the first conductive pad 54 and the second conductive pad 56.

Continuing with FIGS. 5A, 5B, 5C and 5D, the conductive cantilever beam 60 has a longitudinal axis 78. A rotation axis 80 is formed between the conductive anchor 58 and the conductive cantilever beam 60 during thermal expansion of the conductive cantilever beam 60 and the conductive anchor 58. The rotation axis 80 is perpendicular to the longitudinal axis 78. However, since the rotation axis 80 is inset towards the middle portion 64 from an outside edge 82 of the conductive cantilever beam 60, the outside edge 82 will deflect towards the substrate 52 during thermal expansion of conductive cantilever beam 60 as shown in FIG. 5B by an arrow adjacent to outside edge 82. As a result, a tip 84 of the conductive cantilever beam 60 deflects away from substrate 52 in a direction shown in FIG. 5B by an arrow adjacent the tip 84. Therefore, a pair of electrical contacts 86 on the bottom surface 70 of the conductive cantilever beam 60 cannot come into contact with the second conductive pad 56 due to thermal expansion alone during manufacturing or operation.

Figure 6:
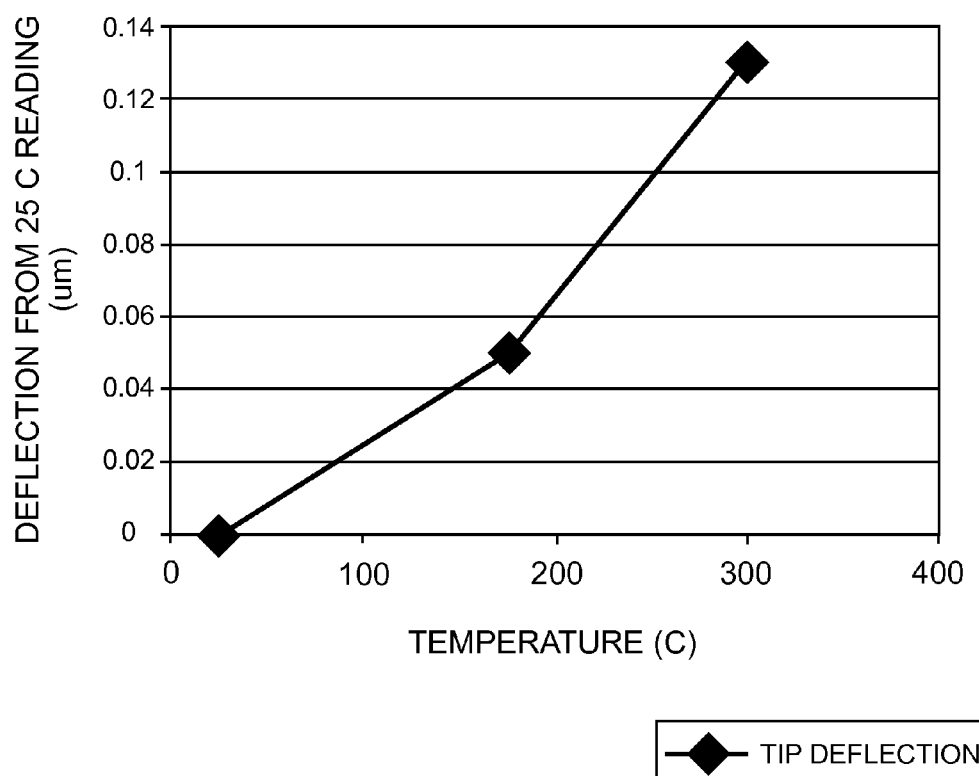
FIG. 6 is a graph depicting an improvement in cantilever tip deflection over the standard MEMS switch exposed to the thermal environment of a MEMS switch manufacturing process.

In fact, the deflection of the tip 84 due to thermal expansion alone may be considered positive as illustrated by FIG. 6, which is a graph of a positive cantilever beam tip deflection over a temperature range from about 25° C. to about 300° C. As depicted in FIG. 6, a tip deflection response for the tip 84 of conductive cantilever beam 60 is graphed with a solid line. The tip 84 of the conductive cantilever beam 60 deflects upwardly away from the substrate 52 about 0.13 micrometers (μm) due to the thermal expansion of the MEMS switch 50 while being exposed to a 300° C. temperature during manufacturing.

Figure 7:
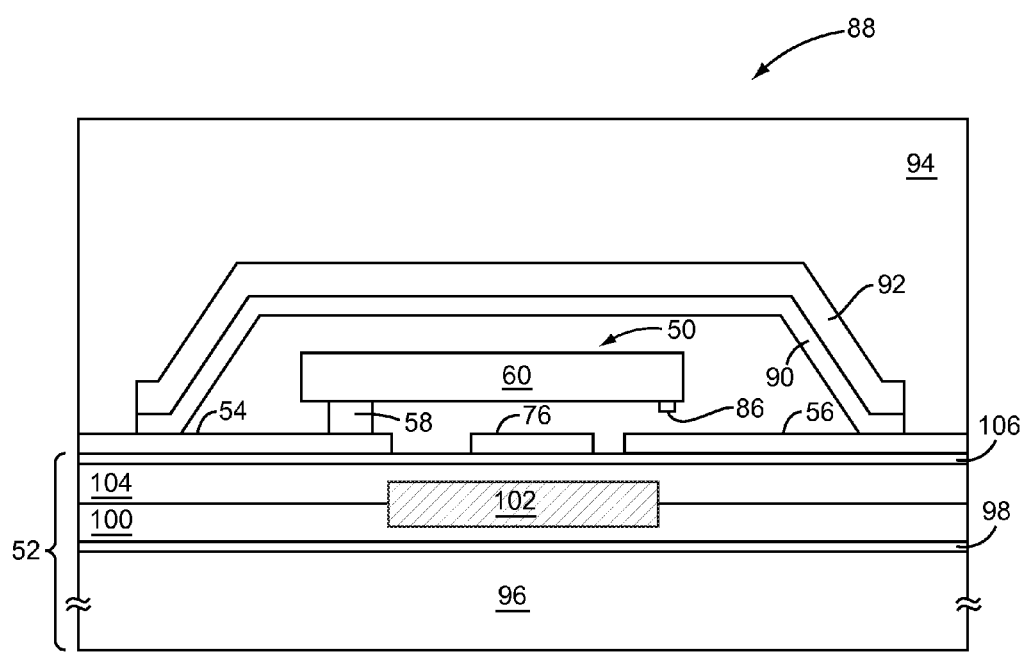
FIG. 7 depicts the MEMS switch of FIG. 5A integrated into a semiconductor device in accordance with the present disclosure.

Turning now to FIG. 7, a semiconductor device 88 incorporating the MEMS switch 50 (FIGS. 5A, 5B, 5C, and 5D) is disclosed. The MEMS switch 50 may be encapsulated by one or more encapsulating layers 90 and 92, which make up a wafer level package (WLP) around the MEMS switch 50. Moreover, the encapsulating layers 90 and 92 form a substantially hermetically sealed cavity about the conductive cantilever beam 60. The cavity is generally filled with an inert gas. Once the encapsulation layers 90 and 92 are in place and any other semiconductor components are formed on the semiconductor substrate 52, a plastic overmold 94 may be provided over the encapsulation layers 90 and 92 and any other semiconductor components.

With continued reference to FIG. 7, the substrate 52 is preferably formed using a semiconductor-on-insulator process, such as a silicon- or sapphire-on-insulator process. In particular, the substrate 52 includes a handle wafer 96 that is formed from silicon, sapphire, glass, or like material to form a foundation layer for the semiconductor device 88. The handle wafer 96 is typically a few hundred microns thick. An insulator layer 98 is formed over the handle wafer 96. The insulator layer 98 is generally formed from an oxide, such as Silicon Dioxide ($SiO_2$), which may range in thickness from 0.1 to 2 microns in the preferred embodiment. A device layer 100, which may include one or more layers, is formed using an appropriate semiconductor material.

The device layer 100 is the layer or layers in which a plurality of active semiconductor devices 102, such as transistors and diodes that employ PN junctions, are formed. The plurality of active semiconductor devices may be formed using a complementary metal oxide semiconductor (CMOS) fabrication process. The device layer 100 is initially formed as a base semiconductor layer that is subsequently doped with N-type and P-type materials to form the active semiconductor devices. Thus, the active semiconductor devices, except for any necessary contacts or connections traces, are generally contained within the device layer 100. Those skilled in the art will recognize various techniques for forming active semiconductor devices in the device layer 100. A metal-dielectric stack 104 is formed over the device layer 100, wherein a plurality of metal and dielectric layers are alternated to facilitate connection with and between the active devices formed in the device layer 100. Further, in the preferred embodiment the handle wafer 96 is made of a high-resistivity semiconductor material where resistance is greater than 50 ohm-cm.

With the present disclosure, the plurality of active semiconductor devices 102 may be formed in the device layer 100 and connected to one another via the metal-dielectric stack 104 directly underneath the MEMS switch 50. Since the device layer 100 resides over the insulator layer 98, high voltage devices, which may exceed ten (10) volts in operation, may be formed directly under the MEMS switch 50 and connected in a way to control operation of the MEMS switch 50 or associated circuitry. Although silicon is described in the preferred embodiment, the semiconductor material for the device layer 100 may include gallium arsenide (GaAs), gallium nitride (GaN), indium phosphide (InP), silicon germanium (SiGe), sapphire, and like semiconductor materials. The device layer 100 typically ranges in thickness from 0.1 microns to 20 or more microns.

As illustrated in FIG. 7, a passivation layer 106 may be provided over the metal-dielectric stack 104. A metal layer used to form the first conductive pad 54, the second conductive pad 56, and the actuator plate 76 may be formed over the passivation layer 106 and etched to form the respective ones of the first conductive pad 54, the second conductive pad 56, and the actuator plate 76. Prior to packaging, the conductive cantilever beam 60 is 'released' and is free to actuate or deform. In particular, the conductive cantilever beam 60 may be released following formation of a small micro-cavity surrounding the MEMS switch 50. A sacrificial material such as polymethylglutarimide (PMGI) is etched away using wet etches. Following drying and cleaning of the MEMS switch 50, a dielectric is used to hermetically seal the micro-cavity. The deposition temperature for the dielectric is typically 250° C. Later in the manufacturing process, the device can experience multiple exposures to 260° C. solder reflow during attachment of a module incorporating the MEMS switch 50 to an end-user laminate.

FIGS. 8A, 8B, 8C and 8D depict a micro-electromechanical systems (MEMS) switch 108 that is structured according the present disclosure. The MEMS switch 108 includes a substrate 110 onto which a first conductive pad 112 and a second conductive pad 114 are formed. A first conductive anchor 116 is coupled to the first conductive pad 112. A second conductive anchor 118 is spaced opposed to the first conductor and is also coupled to the first conductive pad 112. A conductive cantilever beam 120 has a first end portion 122, a middle portion 124, a second end portion 126, a top surface 128, and a bottom surface 130 (FIG. 8B). An internal surface 132 extending through the first end portion 122 of the conductive cantilever beam 120 from the top surface 128 through the bottom surface 130 defines an open space 134. The first conductive anchor 116 is attached to the first end portion 122 and extends into the open space 134 towards the middle portion 124 such that the bottom surface 130 of the second end portion 126 of the conductive cantilever beam 120 is suspended and spaced above the second conductive pad 114 by a predetermined distance such as 0.5 micrometers (μm). The second conductive anchor 118 is attached to an external wall 135 of the first end section 122, and extends opposite from the first conductive anchor 116. This particular configuration of the first conductive anchor 116 and second conductive anchor 118 is referred to in this disclosure as a tandem anchor configuration. The second conductive anchor 118 is preferably coupled to the first conductive pad 112. The second end portion 126 of the conductive cantilever beam 120 is suspended over the second conductive pad 114 with the middle portion 124 being between the first end portion 122 and the second end portion 126. A conductive actuator plate 136 is formed onto the substrate 110 at a location beneath the middle portion 124 of the conductive cantilever beam 120 and between the first conductive pad 112 and the second conductive pad 114.

Continuing with FIGS. 8A, 8B, 8C, and 8D, the conductive cantilever beam 120 has a longitudinal axis 138. A rotation axis 140 is formed between the first conductive anchor 116 and the conductive cantilever beam 120 during thermal expansion of the conductive cantilever beam 120 and the first conductive anchor 116. The rotation axis 140 is perpendicular to the longitudinal axis 138. However, since the rotation axis 140 is between the first conductive anchor 116 and the second conductive anchor 118 opposing mechanical forces prevent the conductive cantilever beam 60 from deflecting towards or away from the substrate 110 by more than 0.05 μm during thermal expansion of conductive cantilever beam 60. As a result, a pair of electrical contacts 144 (FIG. 8B) on the bottom surface 130 of the conductive cantilever beam 120 cannot come into contact with the second conductive pad 114 due to thermal expansion alone during manufacturing or operation. Moreover, a semiconductor device similar to semiconductor device 88 (FIG. 7) may be manufactured to incorporate the MEMS switch 108.

In fact, the deflection of the tip 142 due to thermal expansion alone may be considered neutral as illustrated by FIG. 9, which is a graph depicting an improvement in cantilever beam tip deflection over the standard MEMS switch. As depicted in FIG. 9, a standard tip deflection response is graphed with a dashed line. A tip of a MEMS switch labeled STANDARD deflects downwardly at least 0.8 micrometers (μm) due to the thermal expansion of the MEMS while being exposed to a 300° C. temperature during manufacturing.

A MEMS switch having a tip deflection of 0.8 μm due to thermal expansion often leads to a failure of the MEMS switch as well as a failure of a product that may include the MEMS switch. In contrast, a MEMS switch having the tandem anchors configuration of the MEMS switch 108 (FIGS. 8A, 8B, 8C and 8D) has a tip deflection response that relatively neutral. A solid line labeled TANDEM and depicted in the graph of FIG. 9 shows a tip deflection that is less than plus or minus 0.05 μm over a temperature range of −75° C. to 300° C. As a result, a MEMS switch having the tandem anchors configuration of the present disclosure is not likely to fail due to tip deflection during thermal expansion due to manufacturing and operational temperature ranges.

Those skilled in the art will recognize improvements and modifications to the preferred embodiments of the present disclosure. All such improvements and modifications are considered within the scope of the concepts disclosed herein and the claims that follow.

What is claimed is:

1. A micro-electromechanical systems (MEMS) switch having a thermally tolerant anchor configuration comprising:
   a substrate;
   a conductive cantilever beam having a first end portion, a middle portion, a second end portion, a top surface, and a bottom surface, wherein an internal surface defines an open space through the first end portion from the top surface through the bottom surface;

a conductive anchor coupled to the internal surface of the first end portion of the conductive cantilever beam and extending through the open space and coupled to the substrate such that the bottom surface of the second end portion of the conductive cantilever beam is suspended above the substrate by a predetermined distance; and a conductive actuator plate formed on the substrate at a location beneath the middle portion of the conductive cantilever beam; and a second conductive anchor attached to an external wall of the first end portion, and extending opposite from the conductive anchor extending through the open space.

2. The MEMS switch of claim 1 wherein a tip of the conductive cantilever beam tends to deflect away from the substrate during thermal expansion of the conductive anchor and the conductive cantilever beam.

3. The MEMS switch of claim 1 wherein the second conductive anchor is coupled to the substrate.

4. The MEMS switch of claim 2 wherein a tip of the conductive cantilever beam tends to deflect less than 0.05 micrometers (μm) when a temperature of the MEMS switch is within a temperature range of −75° C. to 300° C.

5. A semiconductor device comprising:
a substrate comprising a handle layer, an insulator layer over the handle layer, and a device layer over the handle layer in which a plurality of active semiconductor devices is formed; and
a micro-electromechanical systems (MEMS) switch integrally formed on the substrate, the MEMS switch comprising:
a conductive cantilever beam having a first end portion, a middle portion, a second end portion, a top surface, and a bottom surface, wherein an internal surface defines an open space through the first end portion from the top surface through the bottom surface;
a conductive anchor coupled to the internal surface of the first end portion of the conductive cantilever beam and extending through the open space and coupled to the substrate such that the bottom surface of the second end portion of the conductive cantilever beam is suspended above the substrate by a predetermined distance; and
a conductive actuator plate formed on the substrate at a location beneath the middle portion of the conductive cantilever beam.

6. The semiconductor device of claim 5 wherein a tip of the conductive cantilever beam tends to deflect away from the substrate during thermal expansion of the conductive anchor and the conductive cantilever beam.

7. The semiconductor device of claim 5 further including a second conductive anchor attached to an external wall of the first end portion, and extending opposite from the conductive anchor extending through the open space.

8. The semiconductor device of claim 7 wherein the second conductive anchor is coupled to the substrate.

9. The semiconductor device of claim 7 wherein a tip of the conductive cantilever beam tends to deflect less than 0.05 micrometers (μm) when a temperature of the MEMS switch is within a temperature range of −75° C. to 300° C.

10. The semiconductor device of claim 5 further comprising an overmold covering the MEMS switch and the substrate, wherein an integrated module comprising the plurality of active semiconductor devices and the MEMS switch is formed.

11. The semiconductor device of claim 8 further comprising:
a multilayer encapsulation structure forming an enclosure about the conductive anchor extending through the open space, the second conductive anchor, the conductive cantilever beam and the conductive actuator plate; and
an overmold covering the MEMS switch and the substrate, wherein an integrated module comprising the plurality of active semiconductor devices is formed.

12. The semiconductor device of claim 11 wherein a space encapsulated by the multilayer encapsulation structure is filled with an inert gas.

13. The semiconductor device of claim 5 wherein the device layer comprises silicon and the plurality of active semiconductor devices is formed using a complementary metal oxide semiconductor (CMOS) fabrication process.

14. A method of making a micro-electromechanical systems (MEMS) switch having a thermally tolerant anchor configuration, the method comprising:
providing a substrate;
forming a conductive cantilever beam having a first end portion, a middle portion, a second end portion, a top surface, and a bottom surface, wherein an internal surface defines an open space through the first end portion from the top surface through the bottom surface;
forming a conductive anchor coupled to the internal surface of the first end portion of the conductive cantilever beam and extending through the open space and coupled to the substrate such that the bottom surface of the second end portion of the conductive cantilever beam is suspended above the substrate by a predetermined distance; and
forming a conductive actuator plate on the substrate at a location beneath the middle portion of the conductive cantilever beam; and
forming a second conductive anchor attached to an external wall of the first end portion, and extending opposite from the conductive anchor extending through the open space.

15. The method of claim 14 further including forming an overmold covering the MEMS switch and the substrate, wherein an integrated module comprising a plurality of active semiconductor devices and the MEMS switch is formed.

16. The method of claim 15 wherein at least one of the plurality of active semiconductor devices is formed directly underneath the MEMS switch in a device layer of the substrate.

17. The method of claim 14 further forming:
a multilayer encapsulation structure to provide an enclosure about the conductive anchor, the conductive cantilever beam and the conductive actuator plate; and
an overmold covering the MEMS switch and the substrate, wherein an integrated module comprising a plurality of active semiconductor devices is formed.

18. The method of claim 17 wherein a space encapsulated by the multilayer encapsulation structure is filled with an inert gas.

* * * * *